United States Patent
Aikawa et al.

(10) Patent No.: US 11,817,358 B2
(45) Date of Patent: Nov. 14, 2023

(54) CIRCUIT MODULE AND COMMUNICATION DEVICE

(71) Applicant: Murata Manufacturing Co., Ltd., Kyoto (JP)

(72) Inventors: Kiyoshi Aikawa, Kyoto (JP); Takafumi Kusuyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 313 days.

(21) Appl. No.: 17/142,611

(22) Filed: Jan. 6, 2021

(65) Prior Publication Data

US 2021/0159133 A1 May 27, 2021

Related U.S. Application Data

(63) Continuation of application No. PCT/JP2019/032720, filed on Aug. 21, 2019.

(30) Foreign Application Priority Data

Sep. 28, 2018 (JP) .................................. 2018-183581

(51) Int. Cl.
  *H01L 23/66* (2006.01)
  *H01L 23/31* (2006.01)
  (Continued)

(52) U.S. Cl.
  CPC .......... *H01L 23/14* (2013.01); *H01L 23/3107* (2013.01); *H01L 23/49833* (2013.01);
  (Continued)

(58) Field of Classification Search
  CPC ................. H01L 23/14; H01L 23/3107; H01L 23/49833; H01L 23/49838; H01L 23/66
  See application file for complete search history.

(56) References Cited

U.S. PATENT DOCUMENTS

2008/0261005 A1* 10/2008 Nomiya ................. H01L 23/15
156/89.12
2014/0305686 A1* 10/2014 Kitajima .............. H05K 1/0298
174/260

(Continued)

FOREIGN PATENT DOCUMENTS

CN  105230135 A  1/2016
JP  2001-127588 A  5/2001
(Continued)

OTHER PUBLICATIONS

Yoneyama, Katsuhiro; Apr. 18, 2003; JP 2003115561 A English Translation (Year: 2003).*
(Continued)

*Primary Examiner* — Omar F Mojaddedi
(74) *Attorney, Agent, or Firm* — Pearne & Gordon LLP (57) ABSTRACT

A circuit module includes a first wiring substrate having a first main surface and a plurality of first components mounted on the first main surface. The plurality of first components includes a multilayer component formed as a single chip by being sealed using resin members. The multilayer component includes a second wiring substrate having a second main surface and a third main surface that face each other, a second component mounted on the second main surface, and a third component mounted on the third main surface.

20 Claims, 9 Drawing Sheets

(51) Int. Cl.
- H01L 23/498 (2006.01)
- H01L 23/538 (2006.01)
- H01L 25/18 (2023.01)
- H01L 25/065 (2023.01)
- H05K 3/28 (2006.01)
- H05K 1/14 (2006.01)
- H05K 1/18 (2006.01)
- H01L 23/14 (2006.01)

(52) U.S. Cl.
CPC ........ *H01L 23/49838* (2013.01); *H01L 23/66* (2013.01); *H01L 25/18* (2013.01); *H01L 2223/6688* (2013.01)

(56) References Cited

U.S. PATENT DOCUMENTS

| | | | |
|---|---|---|---|
| 2015/0179621 A1* | 6/2015 | Matsumoto | H01L 23/49811 257/737 |
| 2016/0073499 A1* | 3/2016 | Ogawa | H01L 23/49827 361/736 |
| 2016/0099192 A1 | 4/2016 | Chen et al. | |
| 2018/0227006 A1 | 8/2018 | Yasuda | |
| 2019/0067207 A1* | 2/2019 | Hu | H01L 23/5385 |
| 2019/0393126 A1* | 12/2019 | Yen | H01L 23/3128 |

FOREIGN PATENT DOCUMENTS

| | | | |
|---|---|---|---|
| JP | 2002-344146 A | | 11/2002 |
| JP | 2003-115561 A | | 4/2003 |
| JP | 2003115561 A | * | 4/2003 |
| JP | 2004-135091 A | | 4/2004 |
| JP | 2007-134795 A | | 5/2007 |
| JP | 2009-038259 A | | 2/2009 |
| JP | 2010-177981 A | | 8/2010 |
| JP | 2015-002245 A | | 1/2015 |
| KR | 10-2018-0058807 A | | 6/2018 |
| WO | 2014/017228 A1 | | 1/2014 |
| WO | 2014/188760 A1 | | 11/2014 |
| WO | WO-2017073509 A1 | * | 5/2017 ........... H04B 1/0057 |

OTHER PUBLICATIONS

International Search Report for International Application No. PCT/JP2019/032720 dated Nov. 19, 2019.
Written Opinion for International Application No. PCT/JP2019/032720 dated Nov. 19, 2019.
Korean Office action for 10-2021-7001672 dated Mar. 29, 2022.

* cited by examiner

CIRCUIT MODULE AND COMMUNICATION DEVICE

CROSS REFERENCE TO RELATED APPLICATIONS

This is a continuation of International Application No. PCT/JP2019/032720 filed on Aug. 21, 2019 which claims priority from Japanese Patent Application No. 2018-183581 filed on Sep. 28, 2018. The contents of these applications are incorporated herein by reference in their entireties.

BACKGROUND OF THE DISCLOSURE

Field of the Disclosure

The present disclosure relates to a circuit module and to a communication device including the circuit module.

Description of the Related Art

In mobile communication devices such as mobile phones, the number of circuit elements forming radio-frequency front-end circuits has been increasing, particularly with the development of multi-band technologies, and it is becoming increasingly difficult to reduce the size of front end modules.

International Publication No. 2014/017228 discloses a module that includes a wiring substrate, a first component layer mounted on one main surface of the wiring substrate, and a second component layer mounted on the other main surface of the wiring substrate. In the module disclosed in International Publication No. 2014/017228, the component mounting density is improved and a reduction in the size of the module is realized by mounting components on both main surfaces of the wiring substrate.

However, there is a limit to how much the component mounting density can be improved in the module disclosed in International Publication No. 2014/017228. For example, if mounting of components is restricted to only one main surface of the wiring substrate, components cannot be mounted on the other main surface of the wiring substrate, and therefore the component mounting density cannot be improved. In addition, for example, if the areas of components to be mounted on one main surface of the wiring substrate are larger than the areas of components to be mounted on the other main surface of the wiring substrate, there will be a blank area where no component is mounted on the other main surface, and it will be difficult to improve the component mounting density.

BRIEF SUMMARY OF THE DISCLOSURE

The present disclosure was made in order to solve this problem and it is an object thereof to provide a circuit module capable of improving component mounting density.

In order to achieve the above-described object, a preferred embodiment of the present disclosure provides a circuit module including: a first wiring substrate having a first main surface; and a plurality of first components mounted on the first main surface. The plurality of first components includes a multilayer component as a single chip. The multilayer component includes a second wiring substrate having a second main surface and a third main surface, which face each other, at least one second component mounted on the second main surface, and at least one third component mounted on the third main surface.

According to the preferred embodiment of the present disclosure, the component mounting density can be improved.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereafter, embodiments of the present disclosure and modifications of the embodiments will be described in detail using the drawings. The embodiments and modifications described below each illustrate a comprehensive or specific example of the present disclosure. The numerical values, shapes, materials, constituent elements, arrangement of the constituent elements, the ways in which the constituent elements are connected to each other and so forth given in the following embodiments and modifications are merely examples and are not intended to limit the present disclosure. Constituent elements not described in the independent claims among constituent elements in the following embodiments and modifications are described as arbitrary constituent elements. In addition, the sizes of the constituent elements illustrated in the drawings or the ratios between the sizes are not necessarily strictly accurate.

In the drawings referred to below, an X axis and a Y axis are axes that are perpendicular to each other on a plane that is parallel to main surfaces of a wiring substrate. In addition, a Z axis is an axis that is perpendicular to the main surfaces of the wiring substrate, and a positive Z axis direction indicates an upward direction and a negative Z axis direction indicates a downward direction.

EMBODIMENT 1

Embodiment 1 will be specifically described while referring to FIGS. 1 to 4.

1.1 Arrangement Configuration of Components Inside Circuit Module

Figure 1:
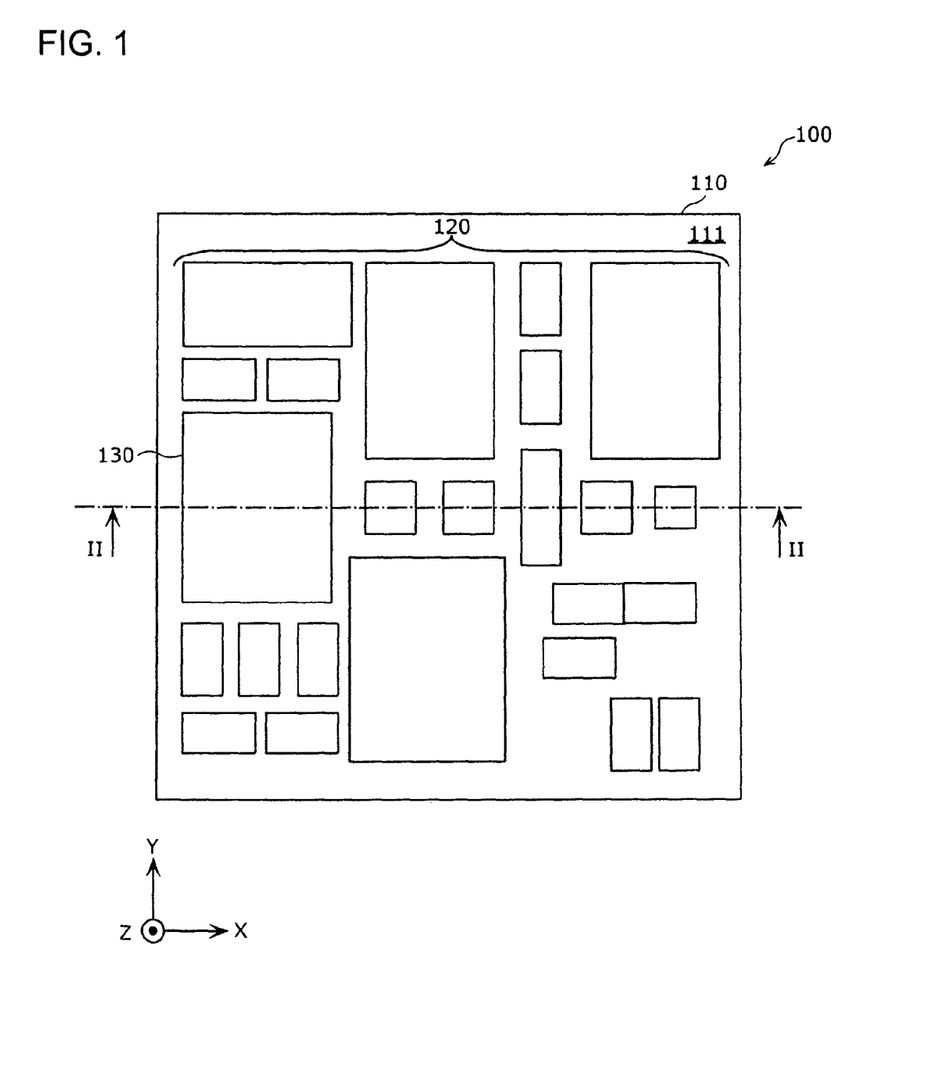
FIG. 1 is a plan view of a circuit module according to embodiment 1.
Figure 2:
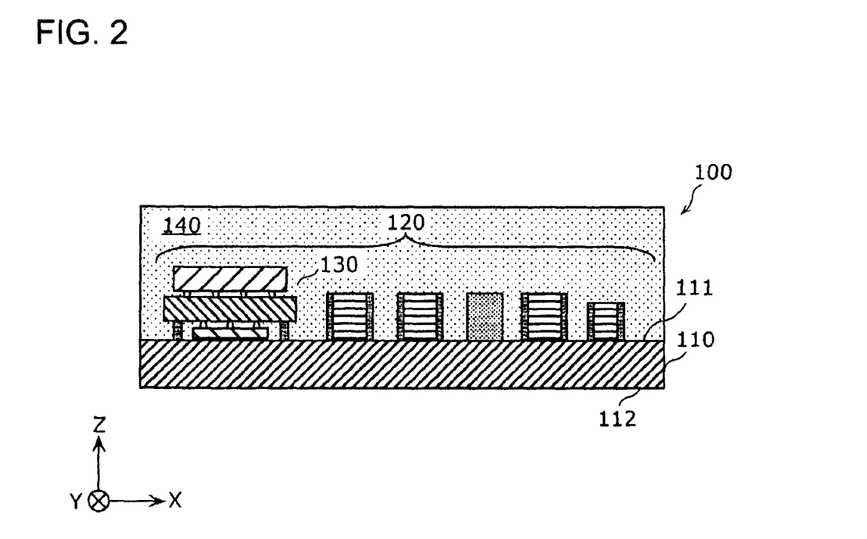
FIG. 2 is a sectional view of the circuit module according to embodiment 1.

First, the arrangement configuration of components inside a circuit module 100 according to embodiment 1 will be described while referring to FIGS. 1 and 2. FIG. 1 is a plan view of the circuit module 100 according to embodiment 1. FIG. 2 is a sectional view of the circuit module 100 according to embodiment 1. Specifically, FIG. 2 is a sectional view of the circuit module 100 taken along line II-II in FIG. 1. Note that the circuit module 100 is illustrated in FIG. 1 without a resin member 140.

The circuit module 100 is a front end module that integrates various functional components used in front end circuits of wireless systems such as Long-Term Evolution (LTE), Wi-Fi (registered trademark), Bluetooth (registered trademark), Global Positioning System (GPS), and so forth. In addition, for example, the circuit module 100 may be a radio frequency identifier (RFID) module. Note that the circuit module according to the embodiment of the present disclosure is not limited to these examples.

As illustrated in FIGS. 1 and 2, the circuit module 100 includes a wiring substrate 110, a plurality of components 120, and a resin member 140.

The wiring substrate 110 is an example of a first wiring substrate and is also referred to as a parent substrate. For example, a low-temperature co-fired ceramic (LTCC) substrate having a multilayer structure consisting of a plurality of dielectric layers or a printed substrate is used as the wiring substrate 110.

As illustrated in FIG. 1, the wiring substrate 110 has a substantially rectangular shape. The shape of the wiring substrate 110 is not limited to a substantially rectangular shape. The wiring substrate 110 may have a polygonal shape other than a substantially rectangular shape or a substantially elliptical shape.

Furthermore, as illustrated in FIG. 2, the wiring substrate 110 has main surfaces 111 and 112, which face each other. The main surface 111 is an example of a first main surface. The main surface 112 is an example of a fourth main surface.

The plurality of components 120 are an example of a plurality of first components and are electronic components that are mounted on the main surface 111 of the wiring substrate 110. Electronic components may also be referred to as circuit elements. As illustrated in FIGS. 1 and 2, the plurality of components 120 include a multilayer component 130.

The multilayer component 130 is an electronic component in which a plurality of components are integrated into a single chip by being sealed with resin members. The multilayer component 130 will be described in detail below using the drawings.

The resin member 140 covers the main surface 111 of the wiring substrate 110 and the plurality of components 120 mounted on the main surface 111. In other words, the circuit module 100 is sealed with the resin member 140. The resin member 140 has the function of ensuring the reliability of the plurality of components 120 in terms of mechanical strength, moisture resistance, and so on. The material of the resin member 140 is not particularly limited and it is sufficient that an electronic component sealing the resin of the related art be used. Note that the resin member 140 is not an essential constituent element of the circuit module according to this embodiment of the present disclosure.

1.2 Arrangement Configuration of Components Inside Multilayer Component

Figure 3A:
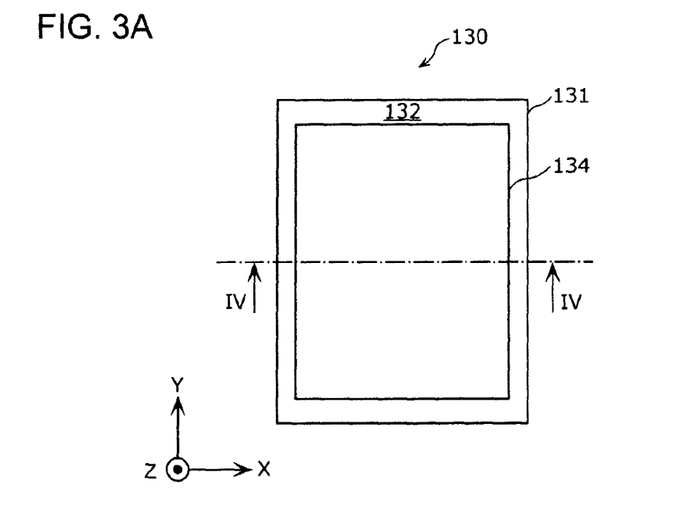
FIG. 3A is a plan view of a multilayer component according to embodiment 1.
Figure 3B:
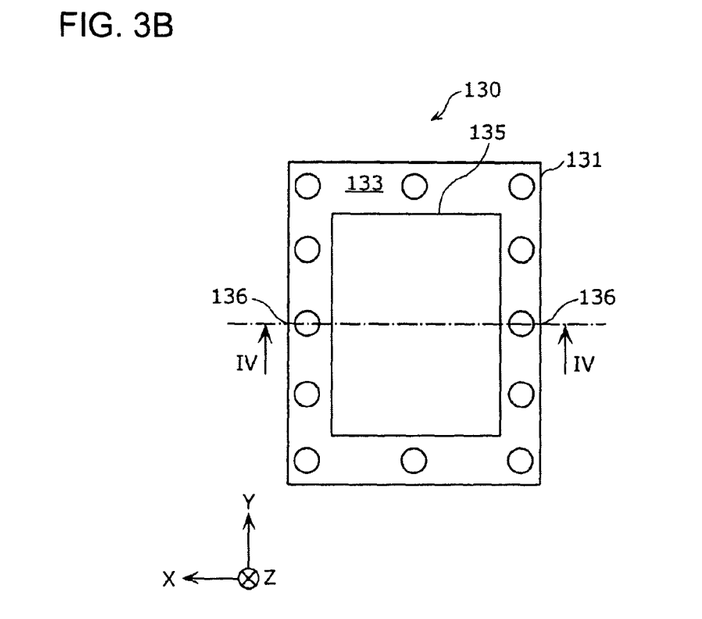
FIG. 3B is a bottom view of the multilayer component according to embodiment 1.
Figure 4:
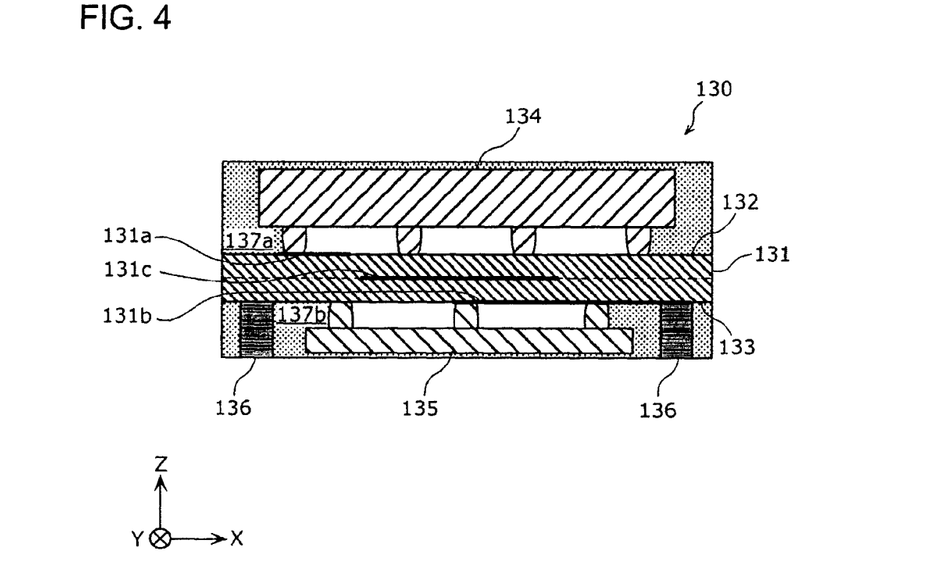
FIG. 4 is a sectional view of the multilayer component according to embodiment 1.

The arrangement configuration of components inside the multilayer component 130 will be described while referring to FIG. 3A, FIG. 3B, and FIG. 4. FIG. 3A is a plan view of the multilayer component 130 according to embodiment 1. FIG. 3B is a bottom view of the multilayer component 130 according to embodiment 1. FIG. 4 is a sectional view of the multilayer component 130 according to embodiment 1. Specifically, FIG. 4 is a sectional view of the multilayer component 130 taken along line IV-IV in FIGS. 3A and 3B. Note that the multilayer component 130 is illustrated in FIGS. 3A and 3B without resin members 137a and 137b.

As illustrated in FIGS. 3A, 3B, and 4, the multilayer component 130 includes a wiring substrate 131, a component 134, a component 135, a plurality of columnar electrodes 136, and the resin members 137a and 137b.

The wiring substrate 131 is an example of a second wiring substrate and is also be referred to as a child substrate. For example, an LTCC substrate having a multilayer structure consisting of a plurality of dielectric layers or a printed substrate is used as the wiring substrate 131.

As illustrated in FIGS. 3A and 3B, the wiring substrate 131 has a substantially rectangular shape. The shape of wiring substrate 131 is not limited to a substantially rectangular shape. The wiring substrate 131 may have a substantially polygonal shape other than a substantially rectangular shape or a substantially oval shape.

As illustrated in FIG. 4, the wiring substrate 131 has main surfaces 132 and 133, which face each other. The main surface 132 is an example of a second main surface. In addition, the main surface 133 is an example of a third main surface.

The main surface 133 of the wiring substrate 131 faces the main surface 111 of the wiring substrate 110. Here, the wiring substrate 131 is arranged parallel to the wiring substrate 110. Note that the wiring substrate 131 does not have to be arranged strictly parallel to the wiring substrate 110 and may be arranged so as to be inclined to some degree with respect to the wiring substrate 110.

The wiring substrate 131 includes a first planar wiring pattern 131a, a second planar wiring pattern 131b, and a planar ground pattern 131c, which are formed on different planes parallel to the main surfaces. The first planar wiring pattern 131a is a wiring pattern for the component 134 mounted on the main surface 132 and is arranged on the main surface 132 side. The second planar wiring pattern 131b is a wiring pattern for the component 135 mounted on the main surface 133 and is arranged on the main surface 133 side. The planar ground pattern 131c is set to a ground potential and is arranged between the first planar wiring pattern 131a and the second planar wiring pattern 131b in the Z direction. Note that, in this disclosure, the meaning of "a plane parallel to a main surface" includes not only a plane that is strictly parallel to a main surface, but also a plane that is substantially parallel to a main surface. In other words, "parallel" means "substantially parallel".

The component 134 is an example of at least one second component and is also referred to as an "upper component". The component 134 is an electronic component that is mounted on the main surface 132 of the wiring substrate 131. Here, the component 134 is mounted face down on the main surface 132.

The component 135 is an example of at least one third component and is also referred to as a "lower component". The component 135 is an electronic component that is mounted on the main surface 133 of the wiring substrate 131. Here, the component 135 is mounted face down on the main surface 133.

In a plan view of the wiring substrate 131, the area of the component 135 is smaller than the area of the component 134 and completely overlaps the area of the component 134. In other words, the area of the component 134 is larger than the area of the component 135 and encompasses the area of the component 135.

The plurality of columnar electrodes 136 extend from the main surface 133 of the wiring substrate 131 to the main surface 111 of the wiring substrate 110. The plurality of columnar electrodes 136 penetrate through the resin member 137b, and the leading ends thereof are exposed from the resin member 137b. The plurality of columnar electrodes 136 are arranged along the edges of the wiring substrate 131 so as to surround the component 135. Note that the plurality of columnar electrodes 136 are not essential constituent elements of the circuit module according to this embodiment of the present disclosure.

The multilayer component 130 exchanges electrical signals with the wiring substrate 110 and the plurality of components 120 mounted on the wiring substrate 110 via the plurality of columnar electrodes 136. In addition, some of the plurality of columnar electrodes 136 are set to the ground potential of the wiring substrate 110.

The resin member 137a covers the main surface 132 of the wiring substrate 131 and the component 134. In addition, the resin member 137b covers the main surface 133 of the wiring substrate 131 and the component 135. In other words, the multilayer component 130 is sealed with the resin members 137a and 137b. In other words, the resin members 137a and 137b cover the main surfaces 132 and 133 and the components 134 and 135 and thereby the multilayer component 130 is integrated as a single component. The resin members 137a and 137b have the function of ensuring the reliability of the multilayer component 130 in terms of mechanical strength, moisture resistance, and so on, and improve the degree of integration and ease of mounting of the multilayer component 130.

The material of the resin members 137a and 137b is not particularly limited. The material of the resin members 137a and 137b may be the same as or different from the material of the resin member 140.

1.3 Effects Etc.

As described above, in the circuit module 100 according to this embodiment, it is possible for the plurality of components 120 mounted on the main surface 111 of the wiring substrate 110 to include the multilayer component 130, which is integrally formed as one chip by being sealed with the resin members 137a and 137b. The multilayer component 130 can include the wiring substrate 131 having the main surfaces 132 and 133, which face each other, the component 134 mounted on the main surface 132 of the wiring substrate 131, and the component 135 mounted on the main surface 133 of the wiring substrate 131. Thus, the two components 134 and 135 can be vertically mounted as the single multilayer component 130 on the main surface 111 of the wiring substrate 110, the component mounting area of the main surface 111 of the wiring substrate 110 can be reduced, and the component mounting density can be improved. For example, even in the case where mounting of components is restricted to only the main surface 111 of the wiring substrate 110, the component mounting density can be improved by mounting the multilayer component 130 on the main surface 111.

Furthermore, in the multilayer component 130, the two components 134 and 135 can be respectively mounted on the main surfaces 132 and 133, which face each other. Therefore, since the two components 134 and 135 are arranged with the wiring substrate 131 interposed therebetween, the isolation between the two components 134 and 135 can be improved compared with the case where the two components 134 and 135 are arranged without the wiring substrate 131 interposed therebetween.

Furthermore, in the circuit module 100 according to this embodiment, the wiring substrate 131 of the multilayer component 130 can include the first planar wiring pattern 131a arranged on the main surface 132 side, the second planar wiring pattern 131b arranged on the main surface 133 side, and the planar ground pattern 131c arranged between the first planar wiring pattern 131a and the second planar wiring pattern 131b and set to the ground potential. Thus, since the planar ground pattern is arranged between the two components 134 and 135, the isolation between the two components 134 and 135 can be further improved.

Furthermore, in the circuit module 100 according to this embodiment, in a plan view of the wiring substrate 131 of the multilayer component 130, the area of the component 134 mounted on the main surface 132 can be made larger than the area of the component 135 mounted on the main surface 133. Thus, the larger component 134 can be arranged on the main surface 132, and the plurality of columnar electrodes 136 and the smaller component 135 can be arranged on the main surface 133. As a result, the occurrence of blank areas on the main surfaces 132 and 133 of the wiring substrate 131 can be suppressed and the component mounting density can be improved.

MODIFICATION OF EMBODIMENT 1

This modification of embodiment 1 mainly differs from embodiment 1 in that components are mounted on both main surfaces of the parent substrate (wiring substrate 110) and in that a plurality of components are mounted on both main surfaces of the child substrate (wiring substrate 131). Hereafter, this modification will be described while referring to FIGS. 5 and 6 focusing on the points that differ from embodiment 1.

Figure 5:
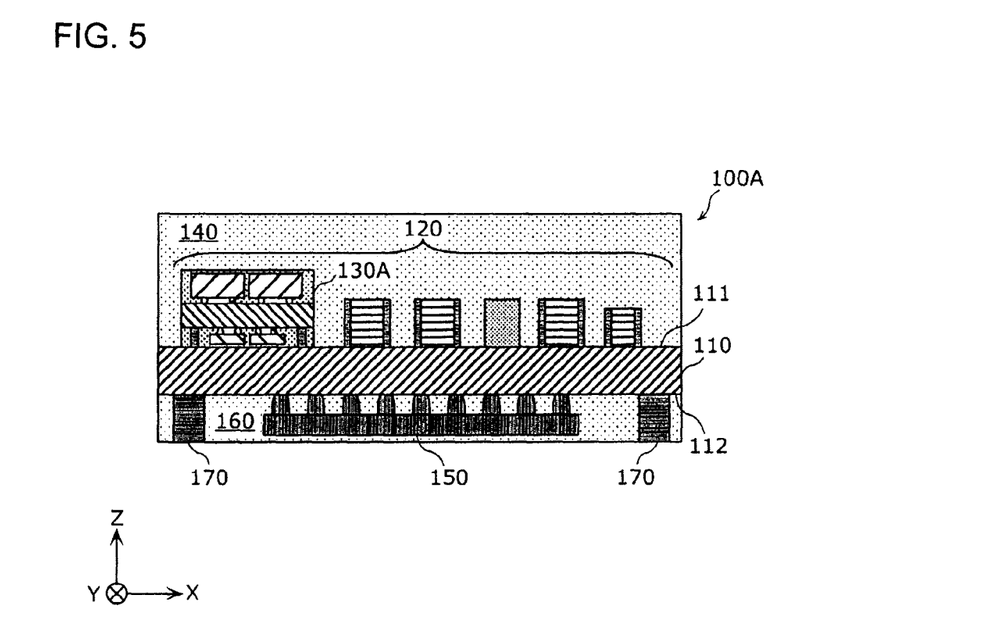
FIG. 5 is a sectional view of a circuit module according to a modification of embodiment 1.

FIG. 5 is a sectional view of a circuit module 100A according to a modification of embodiment 1. As illustrated in FIG. 5, the circuit module 100A includes a component 150, a resin member 160, and a plurality of columnar electrodes 170 in addition to the wiring substrate 110, the plurality of components 120, and the resin member 140.

The component 150 is an example of a fourth component and is an electronic component mounted on the main surface 112 of the wiring substrate 110.

The resin member 160 covers the main surface 112 of the wiring substrate and the component 150. Note that it is not necessary for the resin member 160 to entirely cover the main surface 112 of the wiring substrate and the component 150 mounted on the main surface 112 and the resin member 160 may instead only partially cover the main surface 112 and the component 150. For example, the resin member 160 may just fill the space between the component 150 and the main surface 112. In other words, the resin member 160 does not need to cover the surface of the component 150 on the negative Z axis side. Note that the resin member 160 is not an essential constituent element of the circuit module according to this embodiment of the present disclosure.

The plurality of columnar electrodes 170 extend in the negative Z axis direction from the main surface 112 of the wiring substrate 110. The plurality of columnar electrodes 170 penetrate through the resin member 160, and the leading ends thereof are exposed from the resin member 160. The plurality of columnar electrodes 170 are arranged along the edges of the wiring substrate 110 so as to surround the component 150. Note that the plurality of columnar electrodes 170 are not essential constituent elements of the circuit module according to this embodiment of the present disclosure.

The circuit module 100A exchanges electrical signals with a mounting substrate arranged on the negative Z axis direction side of the circuit module 100A via the plurality of columnar electrodes 170. Furthermore, some of the columnar electrodes 170 are set to the ground potential of the mounting substrate.

Figure 6:
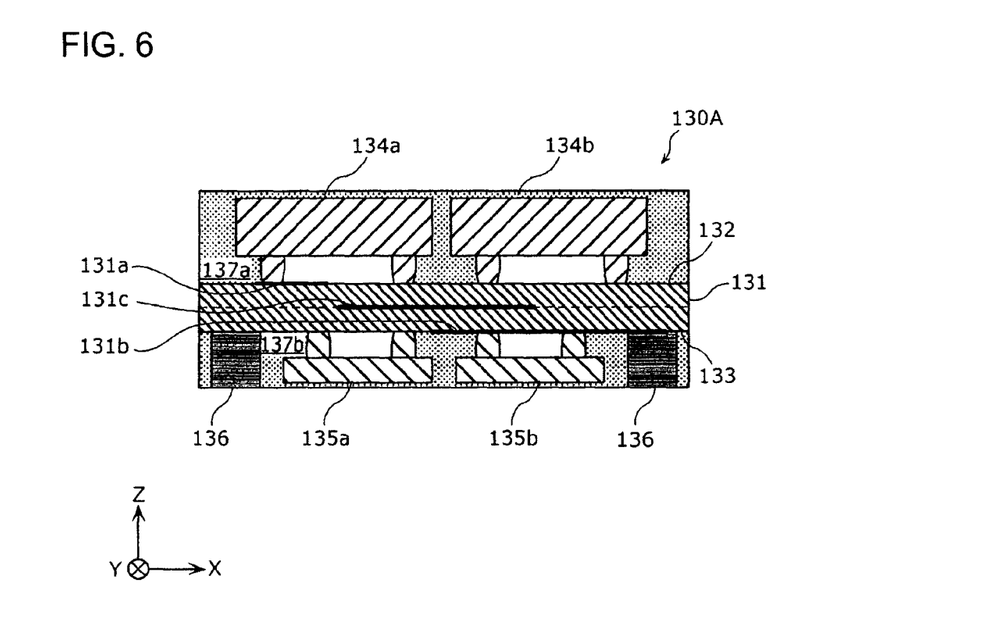
FIG. 6 is a sectional view of the multilayer component according to the modification of embodiment 1.

Next, a multilayer component 130A according to this modification will be described while referring to FIG. 6. FIG. 6 is a sectional view of the multilayer component 130A according to a modification of embodiment 1. As illustrated in FIG. 6, the multilayer component 130A according to this modification includes components 134a and 134b and components 135a and 135b.

The components 134a and 134b are examples of a plurality of second components and are a plurality of electronic components mounted on the main surface 132 of the wiring substrate 131.

The components 135a and 135b are examples of a plurality of third components and are a plurality of electronic components mounted on the main surface 133 of the wiring substrate 131. In a plan view of the wiring substrate 131, the areas of the components 135a and 135b are smaller than the areas of the components 134a and 134b. In other words, the areas of the components 134a and 134b are larger than the areas of the components 135a and 135b.

As described above, in the circuit module 100A according to this modification, the component 150 can also be mounted on the main surface 112, which faces the main surface 111 of the wiring substrate 110. Thus, the component mounting density can be further improved. For example, even in the case where the areas of components to be mounted on the main surface 111 of the wiring substrate 110 are larger than the areas of components to be mounted on the main surface 112 of the wiring substrate 110, the multilayer component 130A can be mounted on the main surface 111, and as a result a blank area of the main surface 112 where no component is mounted can be reduced and the component mounting density can be improved.

Furthermore, in the circuit module 100A according to this modification, a plurality of components can be mounted on each of the main surfaces 132 and 133 of the wiring substrate 131 of the multilayer component 130A. Thus, the component mounting density can be further improved.

EMBODIMENT 2

Next, embodiment 2 will be specifically described while referring to FIGS. 7 to 12. In this embodiment, a radio-frequency module will be described as a specific example of a circuit module.

2.1 Circuit Configurations of Radio-Frequency Module and Communication Device

Figure 7:
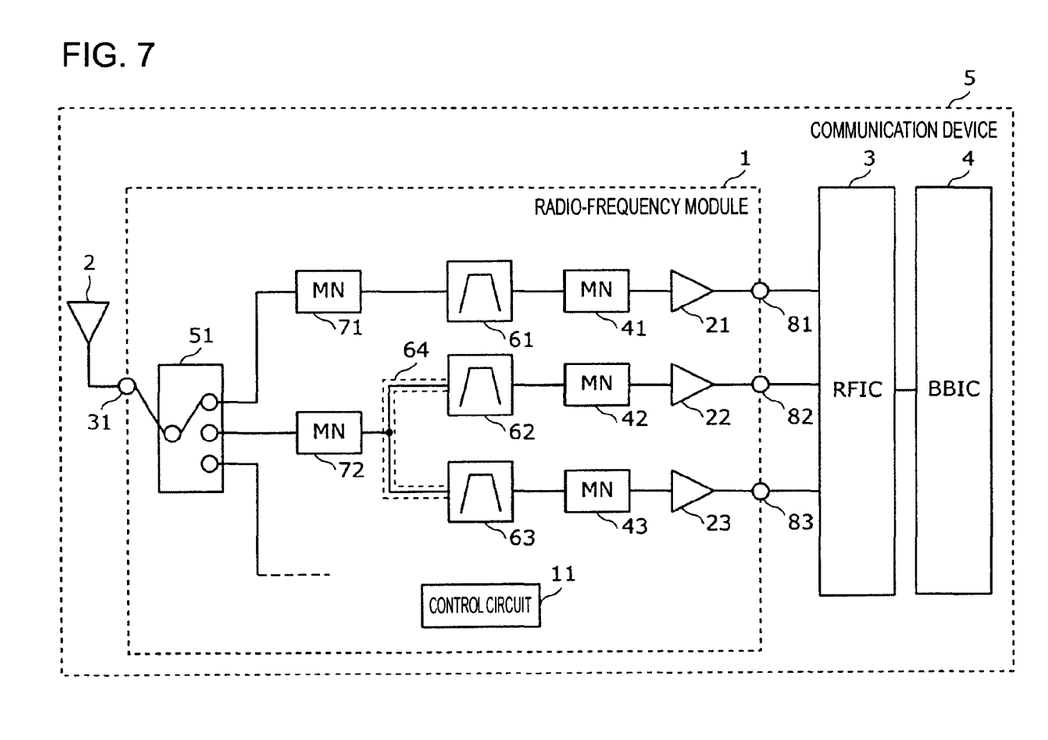
FIG. 7 is a circuit configuration diagram of a radio-frequency module and a communication device according to embodiment 2.

First, the circuit configurations of a radio-frequency module 1 and a communication device 5 according to this embodiment will be specifically described while referring to FIG. 7.

FIG. 7 is a circuit configuration diagram of the radio-frequency module 1 and the communication device 5 according to embodiment 2. As illustrated in FIG. 7, the communication device 5 includes the radio-frequency module 1, an antenna element 2, an RF signal processing circuit (RFIC) 3, and a baseband signal processing circuit (BBIC) 4.

The RFIC 3 is an RF signal processing circuit that processes radio-frequency signals transmitted and received by the antenna element 2. Specifically, the RFIC 3 subjects a radio-frequency reception signal inputted thereto via a reception signal path of the radio-frequency module 1 to signal processing using down conversion and so forth and outputs a reception signal generated through this signal processing to the BBIC 4.

The BBIC 4 is a circuit that performs signal processing using an intermediate frequency band located at a lower frequency than radio-frequency signals that are transmitted through the radio-frequency module 1. A signal processed by the BBIC 4 is used as an image signal for image display or as an audio signal for a telephone call via a speaker, for example.

The antenna element 2 is connected to a common terminal 31 of the radio-frequency module 1, receives a radio-frequency signal from the outside, and outputs the received radio-frequency signal to the radio-frequency module 1.

The antenna element 2 and the BBIC 4 are not essential constituent elements of the communication device 5 according to this embodiment.

Next, the detailed configuration of the radio-frequency module 1 will be described.

The radio-frequency module 1 forms a reception circuit used in carrier aggregation (CA). CA is a communication technology used to simultaneously transmit, simultaneously receive, or simultaneously transmit and receive radio-frequency signals of first and second frequency bands. More specifically, in CA, (1) transmission and/or reception of radio-frequency signals of the first frequency band and (2) transmission and/or reception of radio-frequency signals of the second frequency band can be simultaneously performed.

For example, the communication device including the radio-frequency module 1 according to this embodiment can simultaneously receive a radio-frequency signal of the first frequency band and a radio-frequency signal of the second frequency band. As illustrated in FIG. 7, the radio-frequency module 1 includes the common terminal 31, reception output terminals 81 to 83, a control circuit 11, reception low-noise amplifiers 21 to 23, reception filters 61 to 63, matching networks 41, 42, 43, 71, and 72, and a switch 51.

The common terminal 31 is connected to the antenna element 2.

The reception low-noise amplifiers 21 to 23 are amplifiers that each amplify a reception signal with low noise. The reception low-noise amplifiers 21 to 23 are low-noise amplifiers, for example. A radio-frequency signal amplified by the reception low-noise amplifier 21 is outputted from the reception output terminal 81. In addition, a radio-frequency signal amplified by the reception low-noise amplifier 22 is outputted from the reception output terminal 82. A radio-frequency signal amplified by the reception low-noise amplifier 23 is outputted from the reception output terminal 83.

The reception filter 61 is arranged on a reception path connected between the reception low-noise amplifier 21 and the common terminal 31 and allows a radio-frequency signal of a reception band of communication band A, out of radio-frequency signals inputted from the common terminal 31, to pass therethrough.

The reception filters 62 and 63 are connected in parallel with each other by a wiring line 64. The reception filter 62 is arranged on a reception path connected between the reception low-noise amplifier 22 and the common terminal 31 and allows a radio-frequency signal of a reception band of communication band B (first frequency band), out of radio-frequency signals inputted from the common terminal 31, to pass therethrough. In addition, the reception filter 63 is arranged on a reception path connected between the reception low-noise amplifier 23 and the common terminal 31 and allows a radio-frequency signal of a reception band of communication band C (second frequency band), out of radio-frequency signals inputted from the common terminal 31, to pass therethrough. In other words, the pass band of the reception filter 62 corresponds to the first frequency band for CA, and the pass band of the reception filter 63 corresponds to the second frequency band for CA.

For example, a communication band B40 (Rx 2300-2400 Mhz) and a communication band B1 (2110-2170 Mhz) can be used as a combination for the first frequency band and the second frequency band. At this time, the communication band B40 can be allocated to the reception filter 62 on the upper side, and the communication band B1 can be allocated to the reception filter 63 on the lower side. Thus, in a plan view, the area of the upper-side reception filter 62 can be made larger than the area of the lower-side reception filter 63.

Next, the reason why the reception filter of the communication band B40 (hereafter, reception filter B40) is larger than the reception filter of the communication band B1 (hereafter, reception filter B1) will be explained while referring to FIGS. 8A and 8B.

Figure 8A:
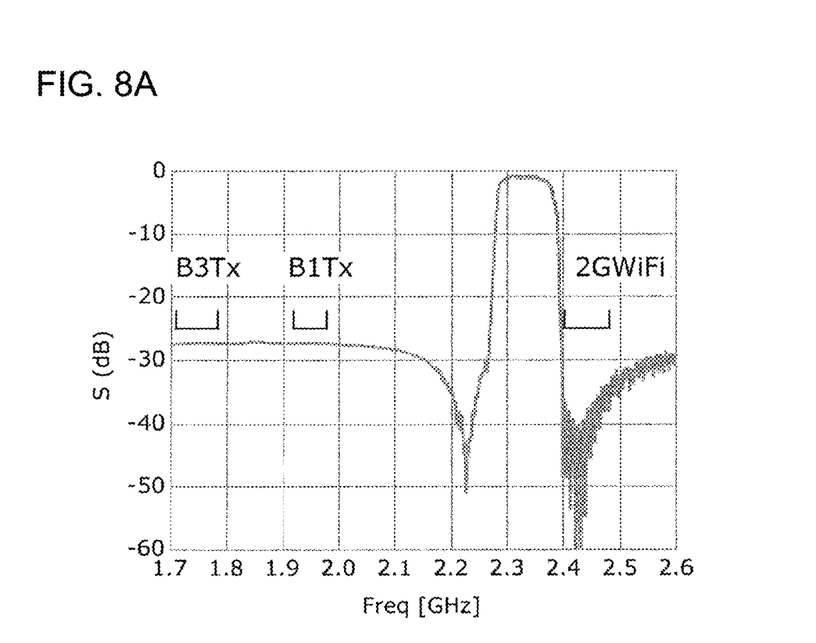
FIG. 8A is a graph illustrating an example of a first frequency band in embodiment 2.

FIG. 8A is a graph illustrating the filter characteristic of the reception filter B40. In addition, FIG. 8B is a graph illustrating the filter characteristic of the reception filter B1. Communication bands used in the vicinities of the pass bands of the reception filters are illustrated in FIGS. 8A and 8B.

As illustrated in FIG. 8A, a 2G WiFi communication band is adjacent to the high-frequency side of the pass band of the reception filter B40. Therefore, steepness is required at the high-frequency side of the pass band of the reception filter B40 in order to avoid overlapping between the pass band of the reception filter B40 and the 2G WiFi communication band. When a surface acoustic wave filter is used as the reception filter B40, the area of the surface acoustic wave filter is relatively large because the number of stages in the ladder circuit is increased and the number of resonators is increased.

Figure 8B:
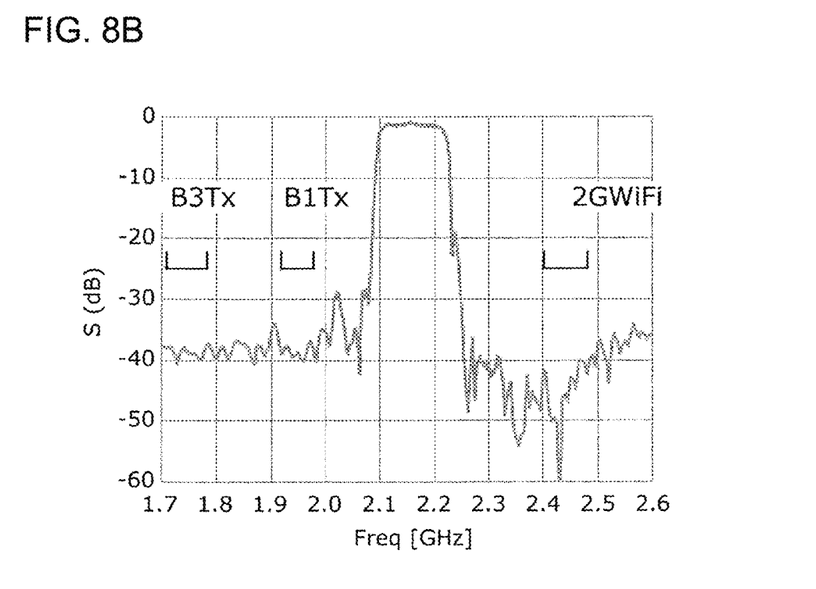
FIG. 8B is a graph illustrating an example of a second frequency band in embodiment 2.

On the other hand, as illustrated in FIG. 8B, the pass band of the reception filter B1 is located at a lower frequency than the pass band of the reception filter B40, and there is room between the pass band of the reception filter B1 and each of the communication bands (B1 Tx and 2G WiFi) adjacent to the pass band of the reception filter B40. In this case, the number of stages of the ladder circuit of the reception filter B1 may be smaller than the number of stages of the ladder circuit of the reception filter B40, and the area of the reception filter B1 can be made comparatively small.

Note that the factors affecting the size of a reception filter are not limited to how close the passband of the reception filter is to an adjacent communication band. For example, if there is a requirement for a high electric power handling capability, the size of the reception filter may be increased in order to reduce power density.

The reception filters 61 to 63 may be, for example, formed of any one of surface acoustic wave filters, acoustic wave filters that use bulk acoustic waves (BAW), film bulk acoustic resonator (FBAR) filters, LC resonance filters, and dielectric filters, but are not limited to being formed of these example filters.

The matching network 41 is arranged on a reception path between the reception low-noise amplifier 21 and the reception filter 61 and performs impedance matching between the reception low-noise amplifier 21 and the reception filter 61. The matching network 42 is arranged on a reception path between the reception low-noise amplifier 22 and the reception filter 62 and performs impedance matching between the reception low-noise amplifier 22 and the reception filter 62. The matching network 43 is arranged on a reception path between the reception low-noise amplifier 23 and the reception filter 63 and performs impedance matching between the reception low-noise amplifier 23 and the reception filter 63. These matching networks 41 to 43 each include at least either of an inductor and a capacitor.

The switch 51 is arranged on a signal path connected between the common terminal 31 and the reception filters 61 to 63 and switches the common terminal 31 and each of the reception low-noise amplifiers 21 to 23 between being in a conductive state and a non-conductive state with each other. More specifically, the switch 51 switches (1) a connection between the common terminal 31 and the reception filter 61, (2) a connection between the common terminal 31 and the reception filters 62 and 63, and (3) a connection between the common terminal 31 and another filter (not illustrated). Note that the switch 51 may be formed of a switch circuit that makes only one connection out of (1) to (3) or may be formed of a multiple connection switch circuit that can simultaneously make two or more connections out of (1) to (3).

The matching network 71 is arranged on a path connected between the switch 51 and the reception filter 61 and performs impedance matching between the antenna element 2 and the switch 51 and the reception filter 61. The matching network 72 is arranged on a path connected between the switch 51 and the reception filters 62 and 63 and performs impedance matching between the antenna element 2 and the switch 51 and the reception filters 62 and 63. These matching networks 71 and 72 each include at least either of an inductor and a capacitor.

The control circuit 11 controls connections of the switch 51 on the basis of the communication bands (frequency bands) that are to be used. Specifically, the control circuit 11 switches connections of the switch 51 using a control signal (not illustrated). Note that the control circuit 11 may be provided outside the radio-frequency module 1, for example, may be provided in the RFIC 3 or the BBIC 4.

With the above circuit configuration, the radio-frequency module 1 according to this embodiment is able to switch between reception of a radio-frequency signal of a communication band of communication band A and simultaneous reception of radio-frequency signals of communication bands of communication band B and communication band C.

Figure 9A:
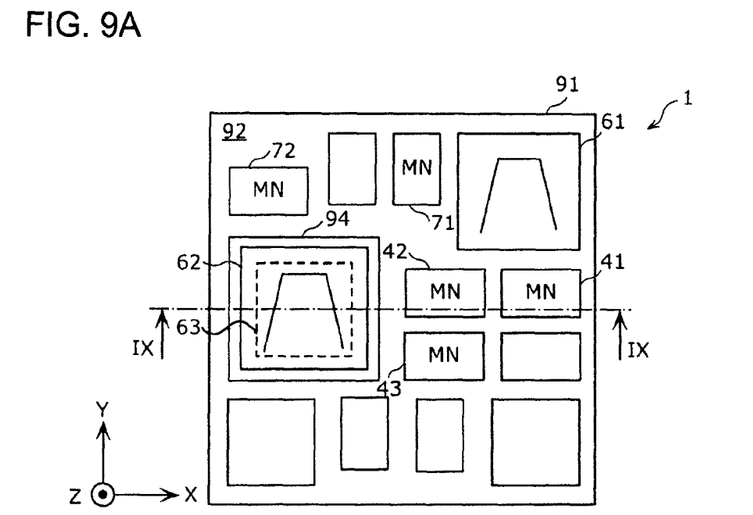
FIG. 9A is a plan view of the radio-frequency module according to embodiment 2.
Figure 9B:
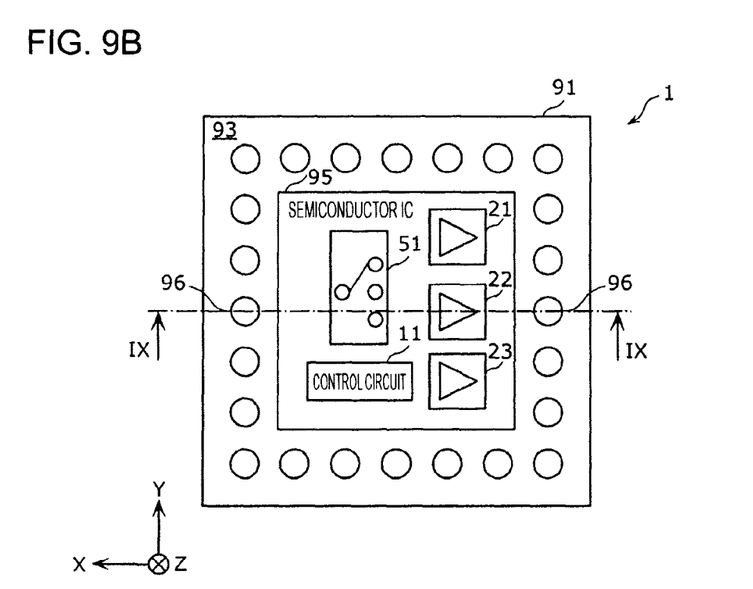
FIG. 9B is a bottom view of the radio-frequency module according to embodiment 2.

2.2 Arrangement Configuration of Circuit Elements Inside Radio-Frequency Module Next, the arrangement configuration of circuit elements forming the radio-frequency module 1 will be described while referring to FIGS. 9A, 9B, and 10. FIG. 9A is a plan view of the radio-frequency module 1 according to embodiment 2. FIG. 9B is a bottom view of the radio-frequency module 1 according to embodiment 2. In addition, FIG. 10 is a sectional view of the radio-frequency module 1 according to embodiment 2.

Figure 10:
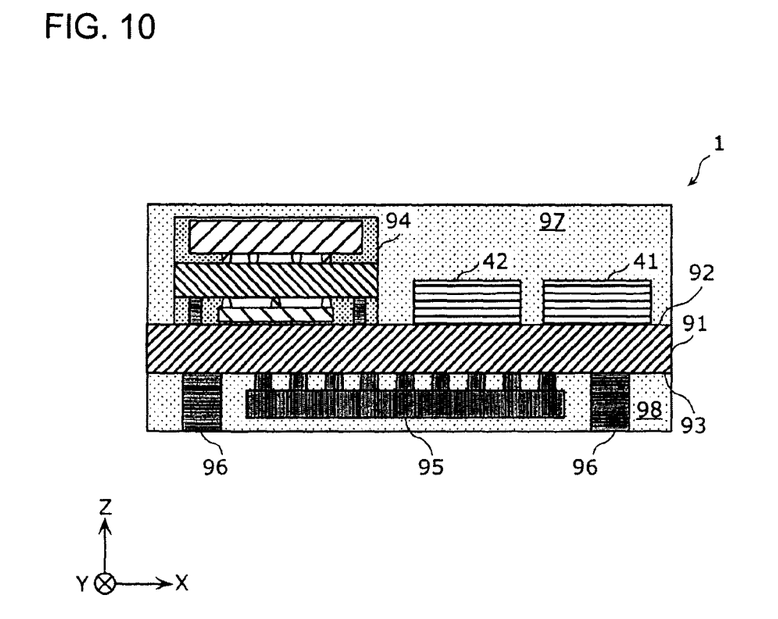
FIG. 10 is a sectional view of the radio-frequency module according to embodiment 2.

Specifically, FIG. 10 is a sectional view of the radio-frequency module 1 taken along line IX-IX in FIGS. 9A and 9B. Note that the radio-frequency module 1 is illustrated without resin members 97 and 98 in FIGS. 9A and 9B.

As illustrated in FIGS. 9A, 9B, and 10, the radio-frequency module 1 according to this embodiment further includes a module substrate 91, a multilayer component 94, a semiconductor IC 95, a plurality of columnar electrodes 96, the resin members 97 and 98, and other circuit elements (without reference symbols) in addition to the circuit configuration illustrated in FIG. 7.

The module substrate 91 is an example of a first wiring substrate and is also referred to as a parent substrate. The module substrate 91 has a main surface 92 (example of first main surface) and a main surface 93 (example of fourth main surface), which face each other, and is a substrate for mounting the above-described reception circuit. The main surfaces 92 and 93 are examples of a first main surface and a fourth main surface, respectively. For example, an LTCC substrate or a printed substrate is used as the module substrate 91.

The multilayer component 94 is formed of the reception filters 62 and 63. The multilayer component 94 is mounted on the main surface 92 of the module substrate 91. The multilayer component 94 will be described in detail below using the drawings.

The semiconductor IC 95 is an integrated circuit consisting of the control circuit 11, the reception low-noise amplifiers 21 to 23, and the switch 51. The semiconductor IC 95 is mounted on the main surface 93 of the module substrate 91.

The plurality of columnar electrodes 96 extend from the main surface 93 of the module substrate 91. The plurality of columnar electrodes 96 penetrate through the resin member 98, and first ends thereof are exposed from the resin member 98. Note that the plurality of columnar electrodes 96 are not essential constituent elements of the radio-frequency module according to this embodiment of the present disclosure.

The radio-frequency module 1 exchanges electrical signals with a mounting substrate arranged on the negative Z axis direction side of the radio-frequency module 1 via the plurality of columnar electrodes 96. In addition, some of the plurality of columnar electrodes 96 are set to the ground potential of the mounting substrate.

The resin member 97 is arranged on the main surface 92 of the module substrate 91 and covers part of the reception circuit and the main surface 92 of the module substrate 91. The resin member 97 has a function of ensuring the reliability of the circuit elements forming the reception circuit in terms of mechanical strength, moisture resistance, and so on. The resin member 98 is arranged on the main surface 93 of the module substrate 91 and covers part of the reception circuit and the main surface 93 of the module substrate 91. The resin member 98 has a function of ensuring the reliability of the circuit elements forming the reception circuit in terms of mechanical strength, moisture resistance, and so on. The resin members 97 and 98 are not essential constituent elements of the radio-frequency module according to this embodiment of the present disclosure.

As illustrated in FIGS. 9A, 9B, and 10, in the radio-frequency module 1 according to this embodiment, the reception filter 61, the multilayer component 94 including the reception filters 62 and 63, the matching networks 41, 42, 43, 71, and 72, and other circuit elements (without reference symbols) are surface mounted on the main surface 92 of the module substrate 91. On the other hand, the semiconductor IC 95, which includes the control circuit 11, the reception low-noise amplifiers 21 to 23, and the switch 51, is surface mounted on the main surface 93 of the module substrate 91.

Figure 11A:
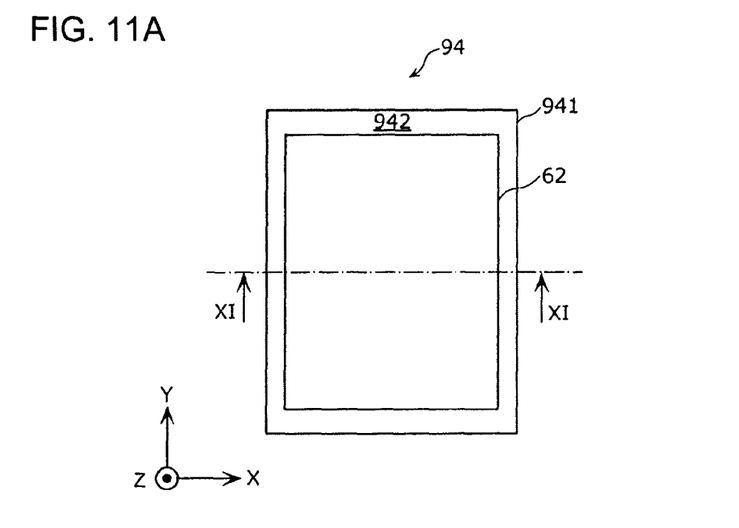
FIG. 11A is a plan view of a multilayer component according to embodiment 2.
Figure 11B:
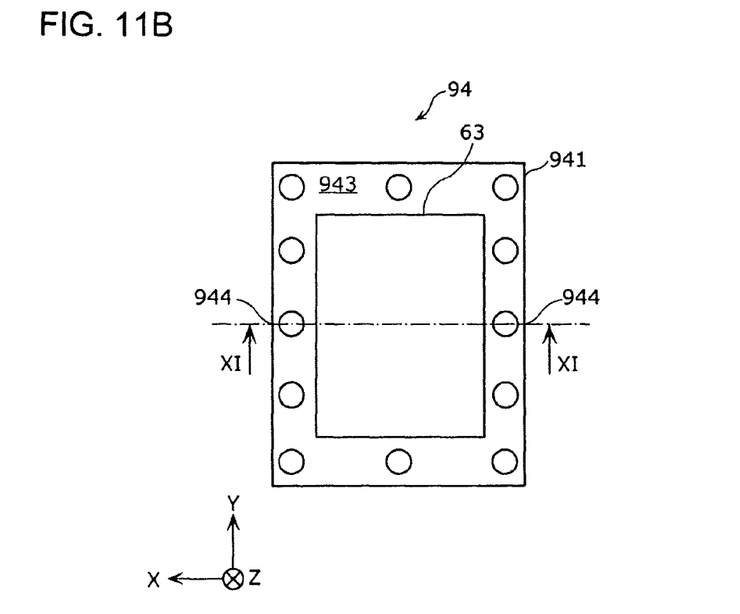
FIG. 11B is a bottom view of the multilayer component according to embodiment 2.
Figure 12:
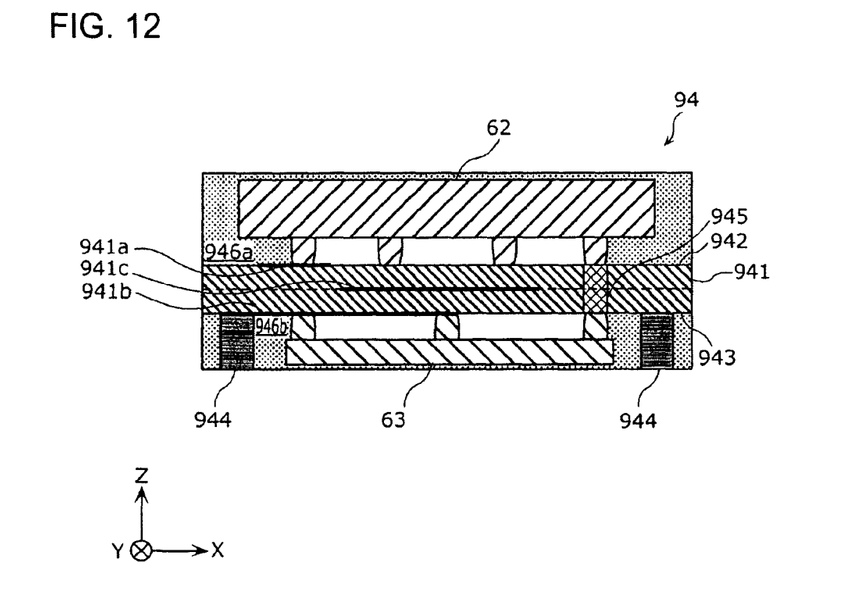
FIG. 12 is a sectional view of the multilayer component according to embodiment 2.

2.3 Arrangement Configuration of Circuit Elements Inside Multilayer Component Next, the arrangement configuration of the circuit elements forming the multilayer component 94 mounted on the main surface 92 of the module substrate 91 will be described while referring to FIGS. 11A, 11B, and 12. FIG. 11A is a plan view of the multilayer component 94 according to embodiment 2. FIG. 11B is a bottom view of the multilayer component 94 according to embodiment 2. FIG. 12 is a sectional view of the multilayer component 94 according to embodiment 2. Specifically, FIG. 12 is a sectional view of the multilayer component 94 taken along line XI-XI in FIGS. 11A and 11B. Note that the radio-frequency module 1 is illustrated without resin members 946a and 946b in FIGS. 11A and 11B.

As illustrated in FIGS. 11A, 11B, and 12, the multilayer component 94 includes a wiring substrate 941, the reception filters 62 and 63, a plurality of columnar electrodes 944, and the resin members 946a and 946b.

The wiring substrate 941 is an example of a second wiring substrate and is also be referred to as a child substrate. For example, an LTCC substrate or a printed substrate is used as the wiring substrate 941.

In addition, the wiring substrate 941 includes a first planar wiring pattern 941a, a second planar wiring pattern 941b, and a planar ground pattern 941c, which are formed on different planes parallel to the main surfaces. The first planar wiring pattern 941a is a wiring pattern for the reception filter 62 and is arranged on a main surface 942 side. The second planar wiring pattern 941b is a wiring pattern for the reception filter 63 and is arranged on a main surface 943 side. The planar ground pattern 941c is set to a ground potential and is arranged between the first planar wiring pattern 941a and the second planar wiring pattern 941b in the Z direction.

The reception filters 62 and 63 are examples of a second component and a third component, respectively, and are also referred to as an upper component and a lower component. The reception filter 62 is mounted on the main surface 942 of the wiring substrate 941, and the reception filter 63 is mounted on the main surface 943, which faces the main surface 942. As illustrated in FIGS. 11A and 11B, in a plan view of the wiring substrate 941, the area of the reception filter 62 is larger than the area of the reception filter 63.

As illustrated in FIG. 12, the reception filters 62 and 63 are connected to each other by a via conductor 945 that penetrates through the wiring substrate 941 in the Z direction. This via conductor 945 corresponds to the wiring line 64 that connects the reception filters 62 and 63 in the circuit configuration in FIG. 7.

The plurality of columnar electrodes 944 extend from the main surface 943 of the wiring substrate 941 to the main surface 92 of the module substrate 91. The plurality of columnar electrodes 944 penetrate through the resin member 946b, and the leading ends thereof are exposed from the resin member 946b. The plurality of columnar electrodes 944 are arranged along the edges of the wiring substrate 941 so as to surround the reception filter 63. Note that the plurality of columnar electrodes 944 are not essential constituent elements of the circuit module according to this embodiment of the present disclosure.

The multilayer component 94 exchanges electrical signals with the module substrate 91 and circuit elements mounted on the module substrate 91 via the plurality of columnar electrodes 944.

The resin member 946a covers the main surface 942 of the wiring substrate 941 and the reception filter 62. In addition, the resin member 946b covers the main surface 943 of the wiring substrate 941 and the reception filter 63. In other words, the multilayer component 94 is sealed with the resin members 946a and 946b. The resin members 946a and 946b have the function of ensuring the reliability of the multilayer component 94 in terms of mechanical strength, moisture resistance, and so on. Furthermore, the resin members 946a and 946b improve the degree of integration and handleability of the multilayer component 94. The material of the resin members 946a and 946b may be the same as or different from the material of the resin members 97 and 98.

2.4 Effects Etc.

As described above, the radio-frequency module 1 according to this embodiment allows acoustic wave filters to respectively be mounted on both main surfaces 942 and 943 of the wiring substrate 941 of the multilayer component 94. When CA is applied in which radio-frequency signals of a first frequency band and a second frequency band are simultaneously transmitted or received, the pass band of the acoustic wave filter mounted on the main surface 942 can be used as the first frequency band, and the pass band of the acoustic wave filter mounted on the main surface 943 can be used as the second frequency band. Thus, two acoustic wave filters used in CA can be arranged close to each other with the wiring substrate 941 interposed therebetween. A wiring line between the two acoustic wave filters can be shortened by connecting the two acoustic wave filters to each other using the via conductor 945, for example. As a result, wiring line loss and matching errors due to wiring lines can be reduced and good characteristics can be obtained for the radio-frequency module 1.

OTHER EMBODIMENTS ETC.

Circuit modules and communication devices according to embodiments of the present disclosure have been described above in the form of embodiments and modifications of the embodiments, but circuit modules and communication devices according to embodiments of the present disclosure are not limited to the above-described embodiments and modifications of the embodiments. Other embodiments realized by combining any of the constituent elements of the above-described embodiments and modifications with one another, modifications obtained by modifying the above-described embodiments and modifications in various ways, as thought of by one skilled in the art, while not departing from the gist of the present disclosure, and various devices having the circuit modules and communication devices built thereinto are included in the scope of the present disclosure.

For example, in the circuit modules, radio-frequency modules, and communication devices according to the embodiments and modifications described above, other circuit elements, wiring lines, and so forth may be inserted midway along paths that connect the circuit elements and signal paths disclosed in the drawings.

In the embodiments and modifications of the embodiments described above, a wiring substrate included in a multilayer component includes a three-layer-structure planar pattern consisting of a first planar wiring pattern, a second planar wiring pattern, and a planar ground pattern, but the present disclosure is not limited to this configuration. For example, the wiring substrate may further include a planar wiring pattern and/or a planar ground pattern or may not include a planar ground pattern.

In the above-described embodiments, in a plan view of the wiring substrate of a multilayer component, the area of the upper component is larger than the area of the lower component, but the present disclosure is not limited to this configuration. For example, the area of the upper component may be smaller than the area of the lower component. In addition, for example, the size of the area of the upper component may be identical to the size of the area of the lower component.

In embodiment 2, a reception circuit has been described as an example of a radio-frequency module (circuit module), but the radio-frequency module may instead be a transmission circuit. Furthermore, the radio-frequency module may be a transmission/reception circuit.

The present disclosure can be used in radio-frequency modules arranged in multi-band front end units and can be widely used in communication devices such as mobile phones including such a radio-frequency module.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A circuit module comprising:
a first wiring substrate having a first main surface; and
a plurality of first components mounted on the first main surface;
wherein the plurality of first components includes a multilayer component as a single chip sealed by a resin member, and
wherein the multilayer component comprises:
a second wiring substrate having a second main surface and a third main surface, wherein the second main surface and the third main surface face each other and are covered by the resin member,
at least one second component mounted on the second main surface, and
at least one third component mounted on the third main surface.

2. The circuit module according to claim 1,
wherein the first wiring substrate has a fourth main surface facing the first main surface, the circuit module further comprising:
a fourth component mounted on the fourth main surface.

3. The circuit module according to claim 1,
wherein the fourth main surface and the fourth component are at least partially integrated, the circuit module further comprising:
a columnar electrode penetrating through the resin member from the fourth main surface.

4. The circuit module according to claim 1,
wherein the at least one second component includes a first acoustic wave filter, and
the at least one third component includes a second acoustic wave filter.

5. The circuit module according to claim 4,
wherein the circuit module is used in carrier aggregation in which radio-frequency signals of a first frequency band and a second frequency band are simultaneously transmitted, simultaneously received, or simultaneously transmitted and received,
a pass band of the first acoustic wave filter corresponds to the first frequency band, and
a pass band of the second acoustic wave filter corresponds to the second frequency band.

6. The circuit module according to claim 1,
wherein the second wiring substrate includes a first planar wiring pattern arranged on a side of the second main surface, a second planar wiring pattern arranged on a side of the third main surface, and a planar ground pattern arranged between the first planar wiring pattern and the second planar wiring pattern and set to a ground potential.

7. The circuit module according to claim 1,
wherein the third main surface of the second wiring substrate faces the first main surface of the first wiring substrate,
the multilayer component further includes a columnar electrode extending from the third main surface to the first main surface, and
in a plan view of the second wiring substrate, an area of the at least one second component is larger than an area of the at least one third component.

8. The circuit module according to claim 1,
wherein the at least one second component includes a plurality of second components, and
the at least one third component includes a plurality of third components.

9. A communication device comprising:
an RF signal processing circuit processing a radio-frequency signal transmitted or received by an antenna element; and
the circuit module according to claim 1, wherein the circuit module transmits the radio-frequency signal between the antenna element and the RF signal processing circuit.

10. The circuit module according to claim 2,
wherein the fourth main surface and the fourth component are at least partially integrated,
the circuit module further comprising:
a columnar electrode penetrating through the resin member from the fourth main surface.

11. The circuit module according to claim 2,
wherein the at least one second component includes a first acoustic wave filter, and
the at least one third component includes a second acoustic wave filter.

12. The circuit module according to claim 3,
wherein the at least one second component includes a first acoustic wave filter, and
the at least one third component includes a second acoustic wave filter.

13. The circuit module according to claim 2,
wherein the second wiring substrate includes a first planar wiring pattern arranged on a side of the second main surface, a second planar wiring pattern arranged on a side of the third main surface, and a planar ground pattern arranged between the first planar wiring pattern and the second planar wiring pattern and set to a ground potential.

14. The circuit module according to claim 3,
wherein the second wiring substrate includes a first planar wiring pattern arranged on a side of the second main surface, a second planar wiring pattern arranged on a side of the third main surface, and a planar ground pattern arranged between the first planar wiring pattern and the second planar wiring pattern and set to a ground potential.

15. The circuit module according to claim 4,
wherein the second wiring substrate includes a first planar wiring pattern arranged on a side of the second main surface, a second planar wiring pattern arranged on a side of the third main surface, and a planar ground pattern arranged between the first planar wiring pattern and the second planar wiring pattern and set to a ground potential.

16. The circuit module according to claim 5,
wherein the second wiring substrate includes a first planar wiring pattern arranged on a side of the second main surface, a second planar wiring pattern arranged on a side of the third main surface, and a planar ground pattern arranged between the first planar wiring pattern and the second planar wiring pattern and set to a ground potential.

17. The circuit module according to claim 2,
wherein the third main surface of the second wiring substrate faces the first main surface of the first wiring substrate,
the multilayer component further includes a columnar electrode extending from the third main surface to the first main surface, and
in a plan view of the second wiring substrate, an area of the at least one second component is larger than an area of the at least one third component.

18. The circuit module according to claim 3,
wherein the third main surface of the second wiring substrate faces the first main surface of the first wiring substrate,
the multilayer component further includes a columnar electrode extending from the third main surface to the first main surface, and
in a plan view of the second wiring substrate, an area of the at least one second component is larger than an area of the at least one third component.

19. The circuit module according to claim 4,
wherein the third main surface of the second wiring substrate faces the first main surface of the first wiring substrate,
the multilayer component further includes a columnar electrode extending from the third main surface to the first main surface, and in a plan view of the second wiring substrate, an area of the at least one second component is larger than an area of the at least one third component.

20. The circuit module according to claim 5,
wherein the third main surface of the second wiring substrate faces the first main surface of the first wiring substrate,
the multilayer component further includes a columnar electrode extending from the third main surface to the first main surface, and
in a plan view of the second wiring substrate, an area of the at least one second component is larger than an area of the at least one third component.

\* \* \* \* \*